United States Patent [19]

Machida

[11] Patent Number: 5,468,977
[45] Date of Patent: Nov. 21, 1995

[54] STANDARD CELLS INTERCONNECTION STRUCTURE INCLUDING A MODIFIED STANDARD CELL

[75] Inventor: Hirohisa Machida, Hyogo, Japan

[73] Assignee: Mitsubishi Denki Kabushiki Kaisha, Tokyo, Japan

[21] Appl. No.: 242,153

[22] Filed: May 13, 1994

Related U.S. Application Data

[63] Continuation of Ser. No. 779,752, Oct. 21, 1991, abandoned.

[30]  Foreign Application Priority Data

Oct. 23, 1990 [JP] Japan ................. 2-286809

[51] Int. Cl.$^6$ .............. H01L 23/522; H01L 23/528; H01L 23/538
[52] U.S. Cl. ............. 257/208; 257/207; 257/211
[58] Field of Search .................. 257/734, 758, 257/773, 774, 775, 776, 909, 207, 211

[56] References Cited

U.S. PATENT DOCUMENTS 4,989,062  1/1991  Takahashi et al. ............ 257/773
5,060,045  10/1991  Owada et al. ................ 257/211
5,151,772  9/1992  Takahashi et al. ............ 257/773

FOREIGN PATENT DOCUMENTS 55-22830   2/1980  Japan ....................... 257/909
61-123153  6/1986  Japan .
63-98132   4/1988  Japan ....................... 257/211

*Primary Examiner*—Rolf Hille
*Assistant Examiner*—Wael M. Fahmy
*Attorney, Agent, or Firm*—Lowe, Price, LeBlanc & Becker

[57]  ABSTRACT

A semiconductor integrated circuit device designed with CAD is formed of a plurality of standard cells including at least four I/O terminals. Each standard cell includes a metal interconnection for a power supply and a metal interconnection for the ground, and also includes an active element formation region and a metal interconnection layer isolated from respective interconnection layers and coupled to a plurality of I/O terminals at a position above it. If it is desired to use the metal interconnection as a power signal line, a via hole is formed in an insulator film, and the metal interconnection layer and the metal interconnection for the power supply are coupled together therethrough.

14 Claims, 14 Drawing Sheets

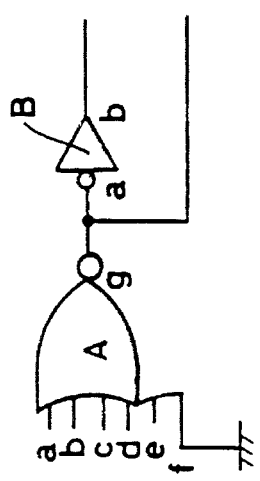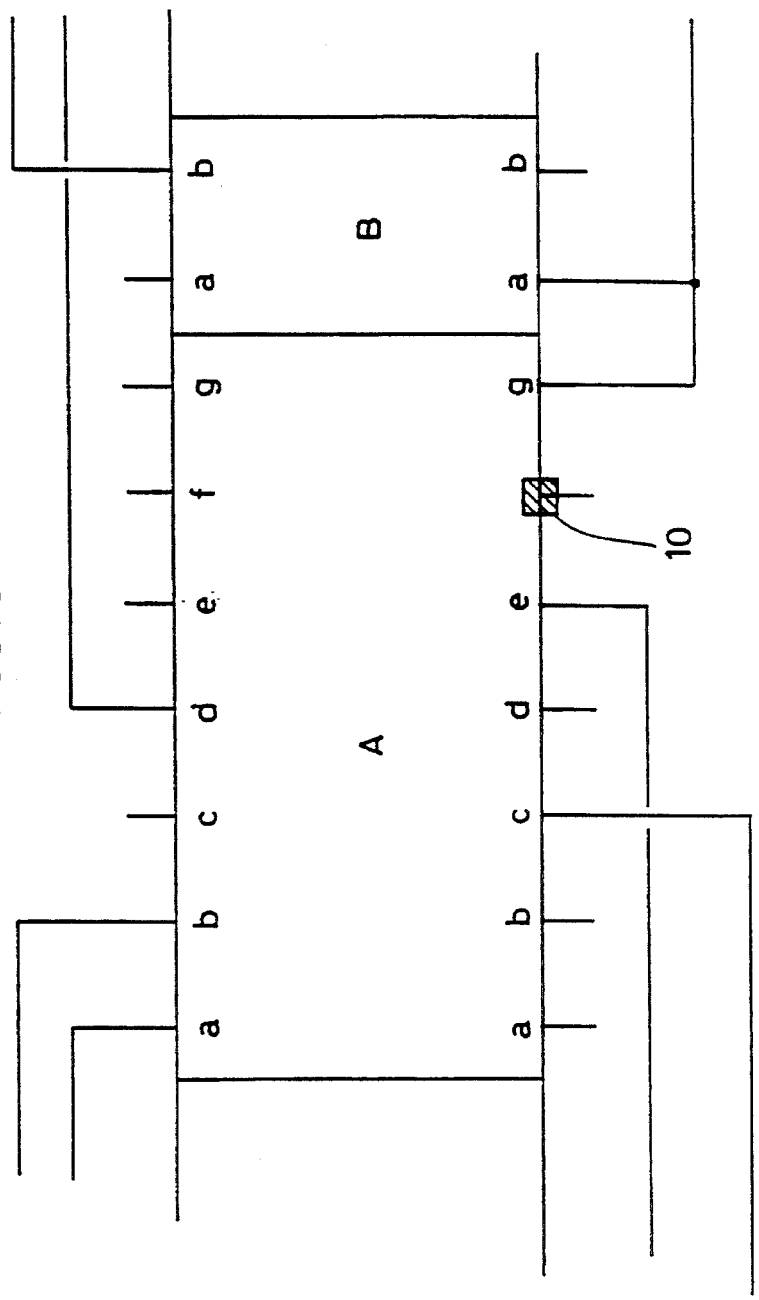
FIG.3A
FIG.3B

STANDARD CELLS INTERCONNECTION STRUCTURE INCLUDING A MODIFIED STANDARD CELL

This application is a continuation of application Ser. No. 07/779,752 filed Oct. 21, 1991, now abandoned.

BACKGROUND OF THE INVENTION

1. Field of the Invention

The present invention relates to a semiconductor integrated circuit device using standard cells and a manufacturing method of interconnection of the same, and particularly to a semiconductor integrated circuit device laid out or designed with CAD (computer aided design) and a wiring method of the same.

2. Description of the Related Art

In recent years, remarkable development of semiconductor techniques has realized integration of many functions and systems in one chip. Therefore, demands for the integration of various systems in one chip have been increased in various applications day by day. Further, users having such demands also wish to obtain integrated circuits having desired functions in a short time. However, manual design of circuits formed of hundreds of thousands transistors requires much time, and discovery of errors in the design also requires considerable time and costs. Therefore, demands for automatic design of the integrated circuits can be automatically carried out with computers as far as possible have currently occurred. CAD techniques have been developed for achieving the above demands, and particularly, automatic layout and interconnection programs using standard cells have been used for designing the semiconductor integrated circuit devices in the simplest manner. The automatic layout and interconnection program using the standard cells are disclosed, for example, in "Semi-Custom-IC Design and VESI", P. J. Hicks, 1983.

Here, the standard cells are used for a method in which standard circuit block cells previously designed and registered in a cell library are used for the design of the LSI's, and thus they are used in one of design methods for the semi-custom LSI's. This method is different from a gate array method which is also used for the semi-custom LSI's in that a mask is formed for every circuit.

FIG. 6 illustrates a general construction of a semi-custom LSI fabricated with an automatic layout and interconnection program using standard cells. Referring to FIG. 6, a semi-custom LSI 10 includes a group of standard cells 11 as well as a power supply line 8a and a ground line 8b for supplying a power supply line and a ground line to the standard cells 11.

FIG. 7 is an enlarged view of a part of the semi-custom LSI shown in FIG. 6. Referring to FIG. 7, the standard cell group 11a includes the standard cells 1a–1e. The standard cells 1a–1e are coupled to standard cells in another standard cell group 11b through signal lines 7a–7c and others, respectively.

Now, contents of the standard cells will be described with reference to FIGS. 8A–8C. FIG. 8A is a view for illustrating the contents in the standard cell 1a. FIGS. 8B and 8C are fragmentary cross sections taken along lines VIIIB—VIIIB and VIIIC—VIIIC in FIG. 8A. Referring to FIG. 8A, the standard cell 1a includes a plurality of longitudinally disposed I/O terminals 2a–2d, metal interconnections 5b and 5a for the ground line and the power supply line which are disposed at upper and lower edges (in FIG. 8A) of the standard cell to cross the I/O terminals 2a–2d, respectively, metal, interconnection layers 3a–3d for coupling the I/O terminals 2a–2d, and input pins 4b and 4a at a ground side and a power supply side for coupling the metal interconnections 5b and 5a for the ground line and for the power supply line to those in an adjacent standard cell, respectively.

The metal interconnection 5a for the ground line and the metal interconnection 5b for the power line are spaced from the metal interconnection layers 3a–3d with an insulator layer 21 therebetween, as shown in FIGS. 8B and 8C.

The standard cell 1a is a circuit which can achieve arbitrary logic such as logical sum, logical product or counting, and various types of circuits have been previously prepared.

As shown in FIG. 8A, an interconnection of a large width is usually used as the metal wiring 5a for the power supply, because a higher current will flow through the power supply line as compared with the general signal lines. Active elements such as transistors are formed in an active element forming region 6 which is located above the metal interconnection layers 3a–3d and between the metal interconnections 5a and 5b. The active elements such as transistors are coupled to the metal interconnection layers 3a–3d and to the metal interconnections 5a and 5b for the ground line and the power line, respectively, to form the standard cell having the intended logical function.

An example in which a logic circuit is formed using the standard cell will be described with reference to FIG. 7. The logic circuit, e.g., for the logical sum or logical product requires power supply signals to be supplied thereto. As already described with reference to FIG. 8A, the metal interconnection for the power supply is laterally disposed in the standard cell 1a. The standard cells 1a–1d are laterally aligned to each other so as to contact the input pins 4b at the ground line side together and to contact the input pins 4a at the power line side together, and the power supply line 8a and the ground line 8b are coupled to opposite sides of a row thus formed. In this manner, the standard cells each having a single logical function are combined to achieve an intended circuit operation in the whole semiconductor integrated circuit.

As shown in FIG. 7, the power supply line 8a and the ground line 8b located outside the standard cell row are usually formed of interconnecting having larger widths than general signal lines 7a–7c. An automatic layout and interconnection program enables automatic fabrication of a construction described above with a computer in a short time.

Meanwhile, the power signal is required to be coupled to the input signal in the logic circuit in some cases. These cases will be described with reference to FIG. 9. The power supply is an essential component in the logic circuit, and generally is not used for the signals. However, in the automatic layout and interconnection program using the standard cells, e.g., for the AND circuits, standardization of the standard cells is achieved by using those having even pins such as 6 pins or 8 pins as the input terminals, and those having odd terminals are not used for the purpose. In this case, if the AND circuit of 6 pins is used as the AND circuit of 5 pins, the remaining one terminal is coupled to the supply potential as shown in FIG. 9(b). In this manner, the AND circuit of 6 pins is used as the AND circuit of 5 pins, as shown in FIG. 9(a). In this case, this power signal is called as the power signal line so as to distinguish it from the power supply line. The automatic layout and interconnection program has conventionally achieved the usage of the power signal line in the standard cell in the following manner.

FIG. 10 illustrates a manner for coupling the power signal line to the standard cell 1c by the automatic layout and interconnection program of the prior art. Referring to FIG. 10, a power signal line 12 is coupled directly between the standard cell 1c and the power supply line 8a located outside a row of the standard cells. The power signal line 12 located between the standard cell 1c and the power supply line 8a located outside the cell row is long and thick. The power signal line 12 have the same configuration as a power coupling line 13a, so that it requires a large interconnecting width and an excessive area in a semi-custom LSI. Therefore, the power signal line 12 which is coupled to an input signal of the standard cell 1c must be reduced in width. It is, however, difficult to distinguish the power signal line 12 and the power coupling line 13a from each other by means of software, so that this method has not been used to a large extent.

FIG. 11 illustrates another example in which the power signals are applied to the standard cell 1c in the automatic layout and interconnection program of the prior art. Referring to FIG. 11, adjacent to the standard cell 1c which is to receive the power signals, there is disposed a special standard cell 9 for supplying the power signals, and the special standard cell 9 is coupled, by its output signal, to the input terminal of the standard. cell 1c which requires the power signals, whereby the power signals are applied thereto. FIG. 12 illustrates this special standard cell 9 in greater details. Referring to FIG. 12, the special standard cell 9 has a construction in which the power supply line 5a in the standard cell and the metal interconnection layer 3 are coupled together through a via hole or a through hole. That is; the metal interconnections of the different layers in the semiconductor integrated circuit are short-circuited in the special standard cell 9. Since the program handles the output of this special standard cell 9 similarly to the general signal lines, it is not necessary to give special attention to the wiring width. In this case, it is necessary to previously describe an item relating to this special standard cell 9 in a logical diagram. The automatic layout and interconnection program uses this logical diagram to achieve the layout and interconnection of the standard cells 1 and the special standard cell 9.

A specific example of the logic circuit using this standard cell 9 will be described below.

FIGS. 13A and 13B illustrate a specific layout of the standard cell in an AND circuit of 6 inputs in which the special standard cell 9 is used for coupling the power signal line. FIG. 13A is a circuit diagram, and FIG. 13B is a layout diagram of a practical standard cell corresponding to it. Referring to FIG. 13B, the special standard cell 9 is disposed adjacent the 6 input AND circuit A.

Meanwhile, the Japanese Patent Laying-Open No. 61-123153 and others have disclosed a construction of a gate array LSI device in which an input terminal of an output circuit having multiple input logical functions is clipped to a predetermined potential. FIG. 14 is a view disclosed in the above publication. Referring to FIG. 14, there are provided input terminals IN1, IN2 and IN3, and a polysilicon interconnection 20 for the clip which is disposed, for example, perpendicularly to the terminals and is coupled to an aluminum interconnection of a power supply $V_{DD}$ through a contact hole 25. If the wiring 20 for the clip is to be coupled to one of the input terminals IN1, IN2 and IN3, a contact hole 21 or the like is provided at an intersection therebetween.

If it is necessary to supply the power signals to the particular standard cell 1c, the conventional automatic layout and interconnection program achieves it in the following manner. In the automatic formation of the layout of the semiconductor integrated circuit by the automatic layout and interconnection program, and particularly when a signal line such as the power signal which exists commonly in the standard cells is coupled as the input signal in the standard cell, there have been large useless region formed. This results in a problem that these regions occupy a large area in the semiconductor integrated circuit.

Further, if the input terminal or others is to be clipped to the predetermined potential in the gate array LSI device, the interconnection for the clip is located outside the cell, which also results in a problem that useless regions increase in the semiconductor integrated circuit.

SUMMARY OF THE INVENTION

Accordingly, it is an object of the invention to eliminate useless regions in a semiconductor integrated circuit device.

Another object of the invention is to eliminate a useless region in a semiconductor integrated circuit device by a simple method.

Still another object of the invention is to eliminate a useless region in a interconnection method for a semiconductor integrated circuit device.

Yet another object of the invention is to facilely eliminate a useless region in an interconnecting method for a semiconductor integrated circuit device.

The above objects of the invention are achieved by an integrated circuit device which is formed of a plurality of standard cells and includes following components. That is; in the integrated circuit device according to the invention, each standard cell includes at least four I/O terminals, a signal line common to the standard cells, and an active element coupled to the I/O terminals which are arranged to cross the signal line and isolated from the signal line by an insulator film; and at least one of the standard cells includes a coupling interconnection layer which extends through the insulator film for coupling the common signal line to at least one of the I/O terminals.

In the semiconductor integrated circuit device according to the invention, the signal line, which is common to the standard cells and is located in the standard cells, is coupled to the I/O terminals of the standard cells. Consequently, useless regions can be eliminated in the semiconductor integrated circuit device.

According to another aspect of the invention, a method for automatically interconnecting a semiconductor integrated circuit with CAD comprises the steps of providing standard cells which exhibit a function of the semiconductor integrated circuit, each standard cell including at least four I/O terminals, a signal line common to the standard cells, and an active element coupled to the I/O terminals which are arranged to cross the signal line and isolated from the signal line by an insulator film; coupling the common signal line to the standard cells; and coupling the common signal line in the standard cells to at least one of the I/O terminals through or by penetrating the insulator film. In the manufacturing method of semiconductor integrated circuit, the signal line, which is common to the standard cells and is located in the standard cells, is coupled to the I/O terminals of the standard cells. Consequently, useless regions can be eliminated in the semiconductor integrated circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are views illustrating an example to which the invention is specifically applied;

DESCRIPTION OF THE PREFERRED EMBODIMENTS

Figure 1A:
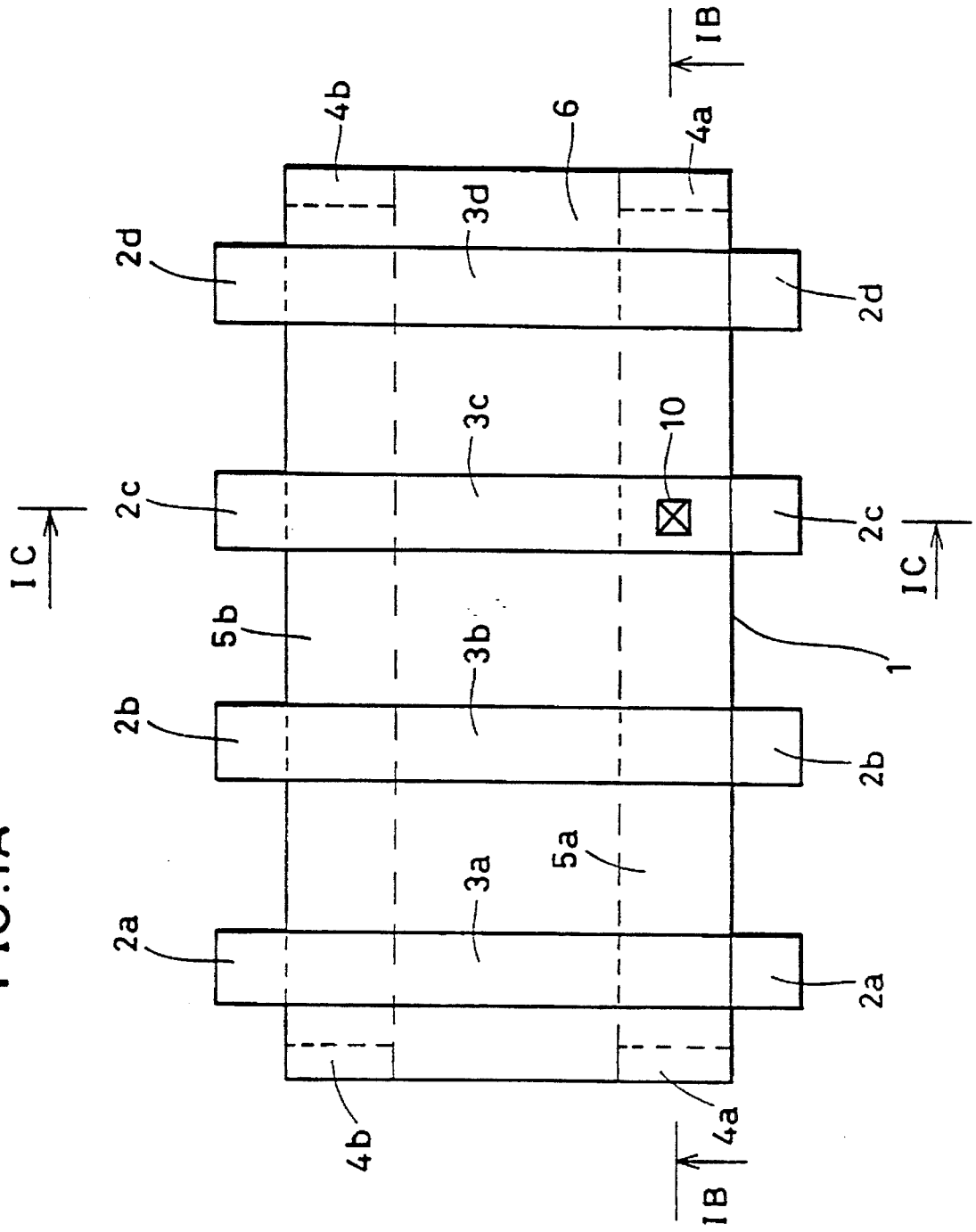
FIGS. 1A, 1B and 1C illustrate standard cells to which the invention is applied.
Figure 1B:
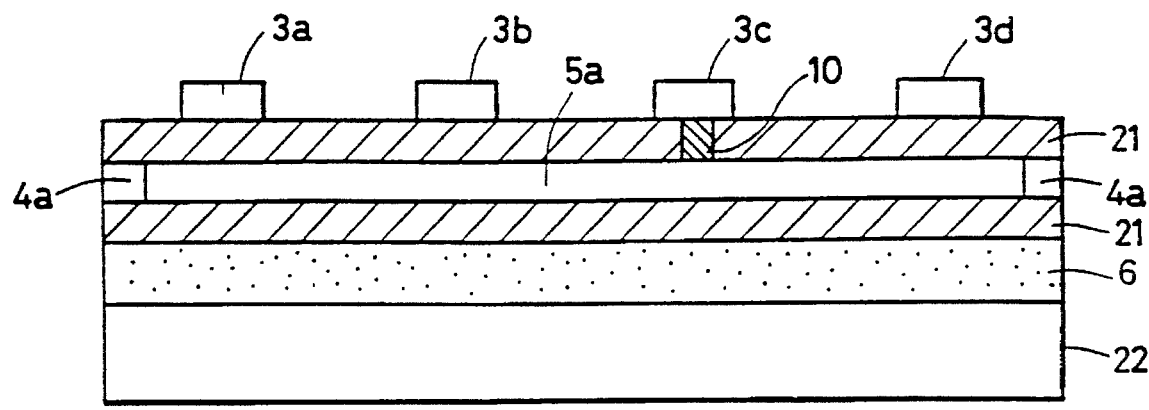
Figure 1C:
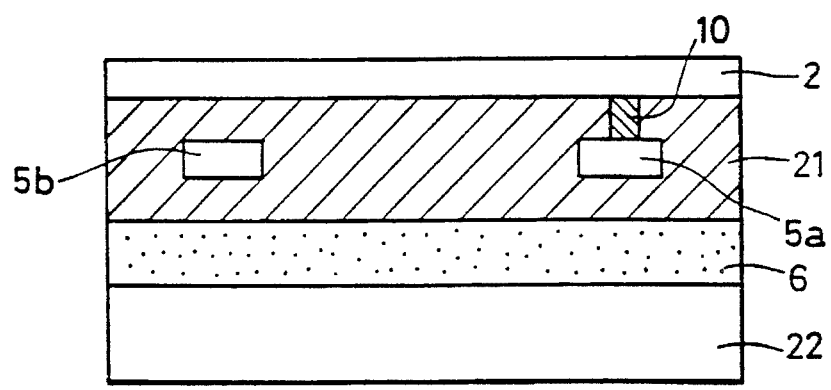
Figure 8A:
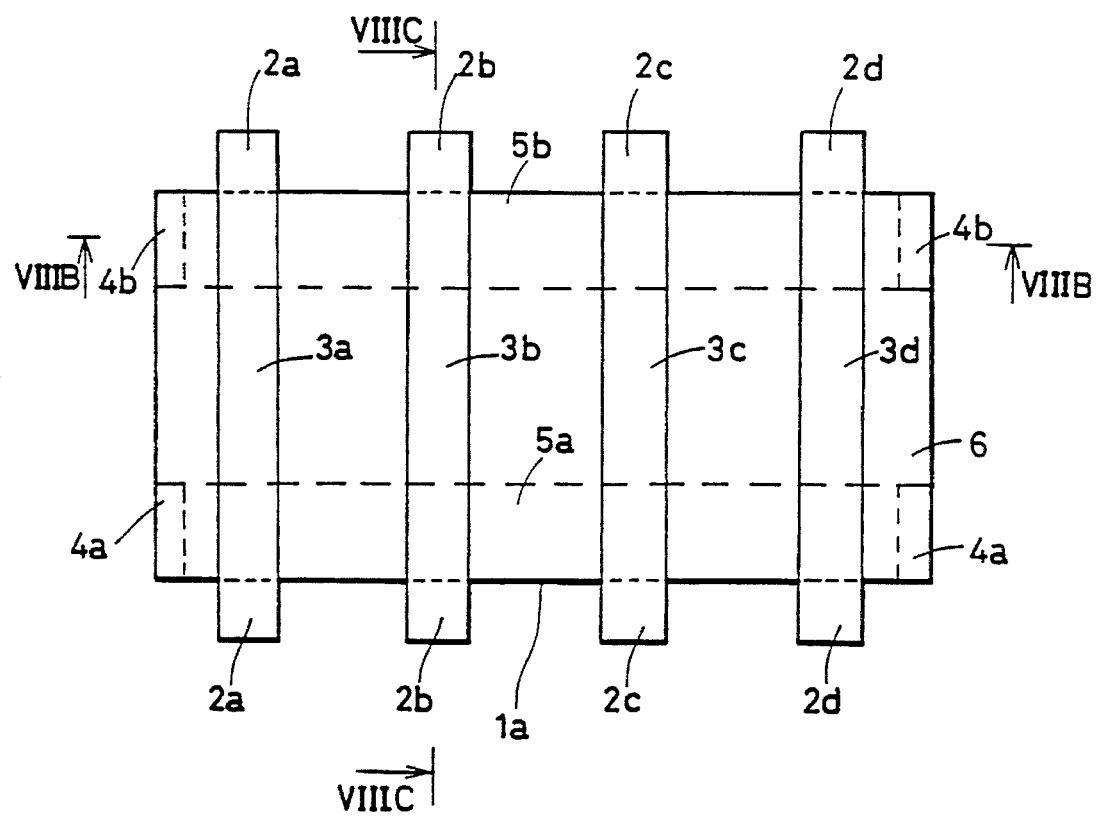
FIG. 8A illustrates a standard cell of a prior art.
Figure 8B:
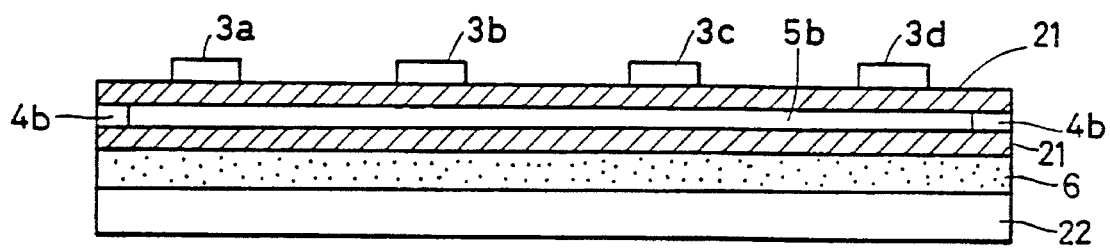
FIGS. 8B and 8C are cross sections taken along lines VIIIB—VIIIB and VIIIC—VIIIC in FIG. 8A.
Figure 8C:
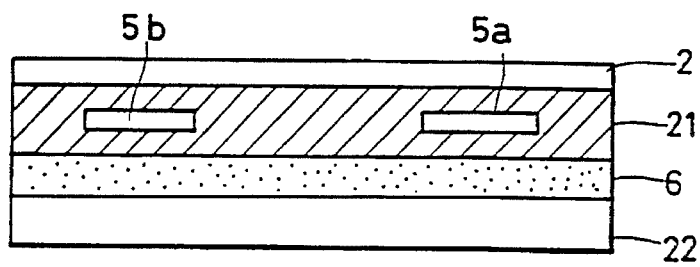
Figure 10:
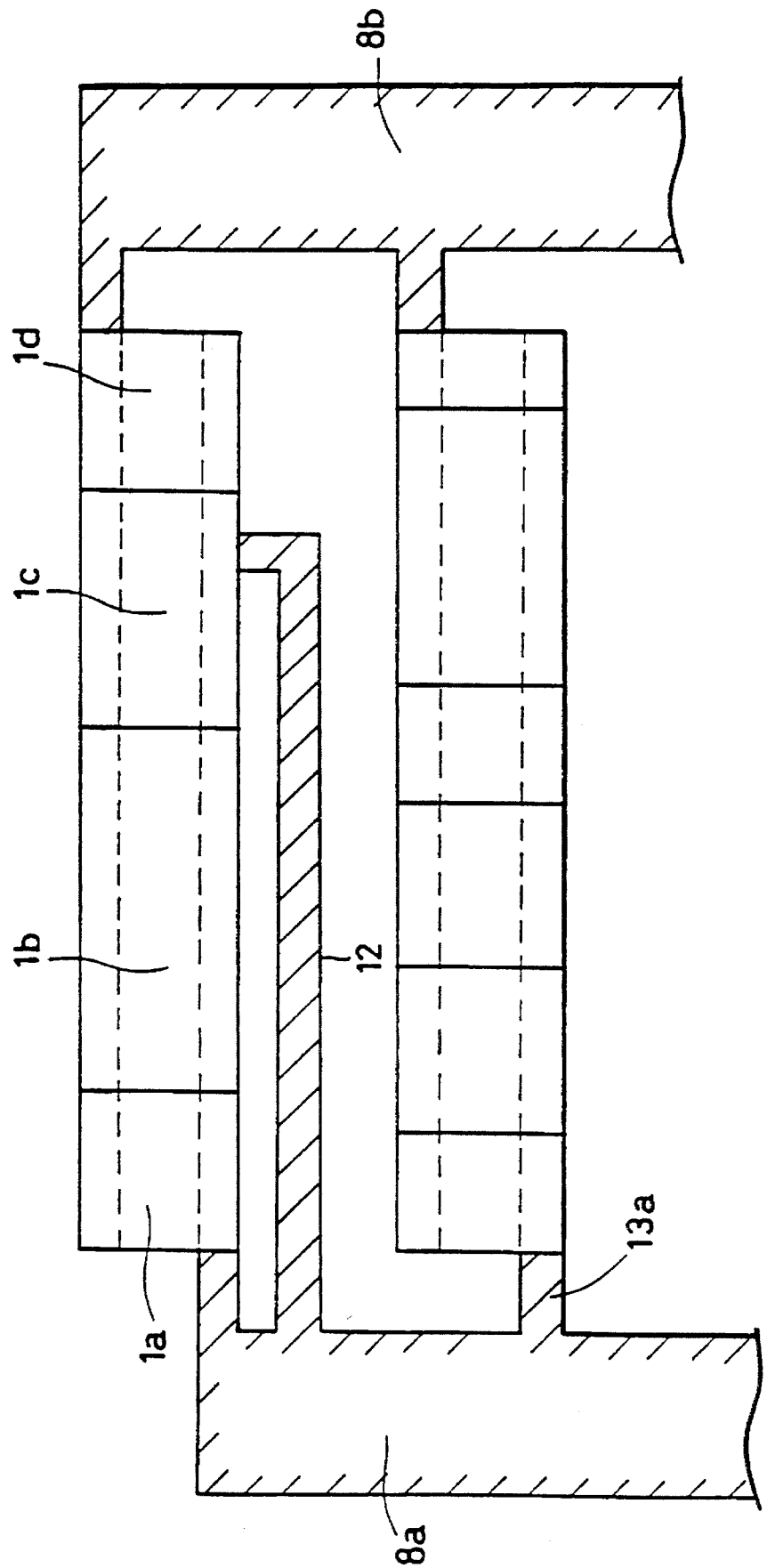
FIGS. 10 and 11 are views for illustrating a method for coupling an input signal and a power supply signal together in an automatic layout and interconnection program of the prior art.

An embodiment of the invention will be described hereinafter with reference to drawings. FIGS. 1A, 1B and 1C correspond to FIGS. 8A, 8B and 8C illustrating a prior art, respectively, and the same references indicate the same portions or members. Referring to FIG. 1A, interconnection is provided through a via hole 10 for coupling a metal wiring 5a for a power supply line and a metal interconnection layer 3c. In an automatic layout and interconnection program, a software for CAD processes such that the via hole 10 may be located at an intersection of the metal interconnection layer 3c and the metal interconnection 5a for the power supply line.

Although the embodiment shown in FIGS. 1A–1C employs the via hole 10 for coupling an I/O terminal and the metal interconnection for the power supply, it is possible to use any other method provided that the I/O terminal and the metal interconnection for the power supply line are coupled together in the standard cell.

Figure 2:
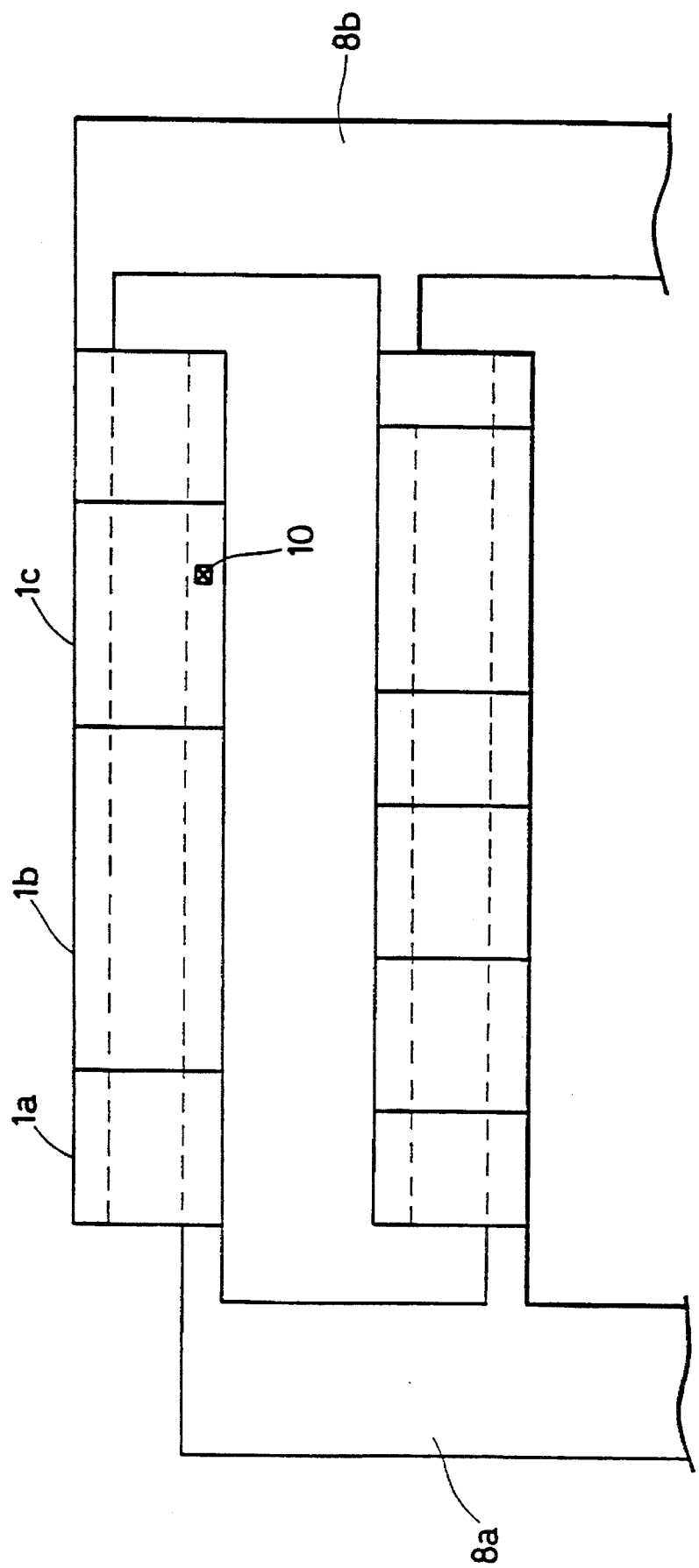
FIG. 2 is a view for illustrating advantages of the invention.
Figure 11:
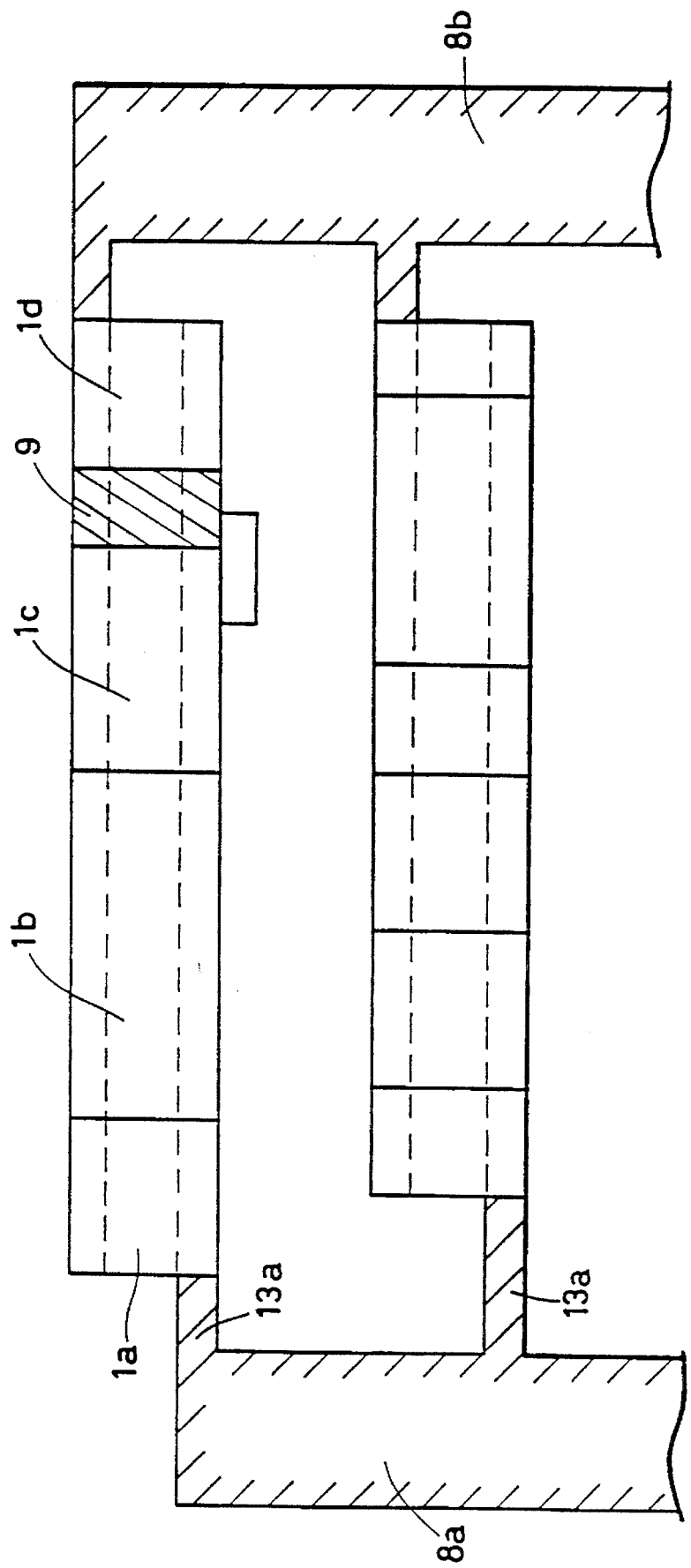
Figure 12:
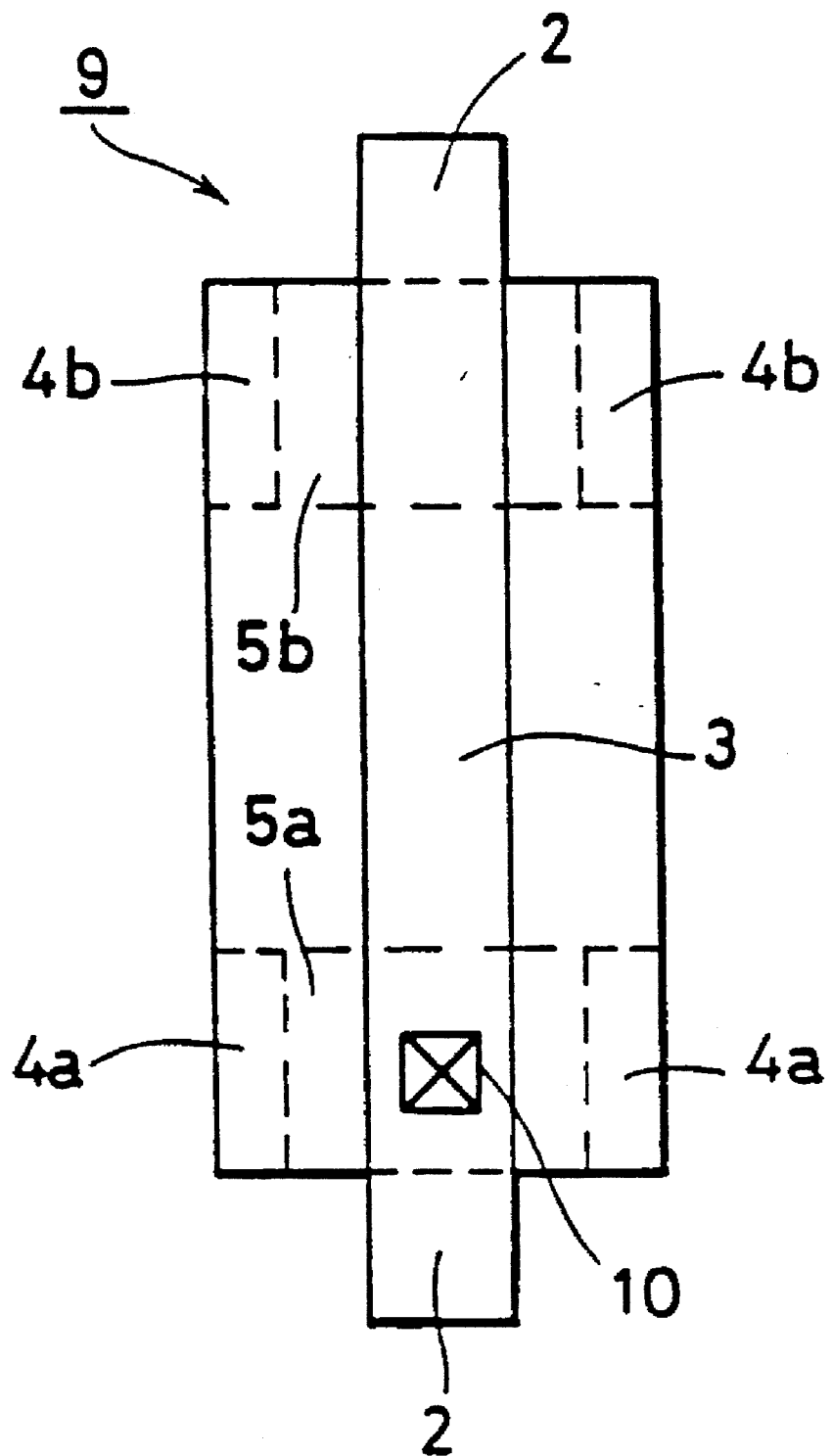
FIG. 12 illustrates a special standard cell used in FIG. 11.

FIG. 2 corresponds to FIG. 11 described before. In FIG. 11, the special standard cell 9 is used for supplying the power signal line to the standard cell 1c. However, according to the invention, the standard cell 1c is provided with the via hole 10 through which the interconnection layer is formed for the same purpose. Consequently, a required area for the semiconductor integrated circuit device is reduced by an amount corresponding to the special standard cell 9.

Figure 13A:
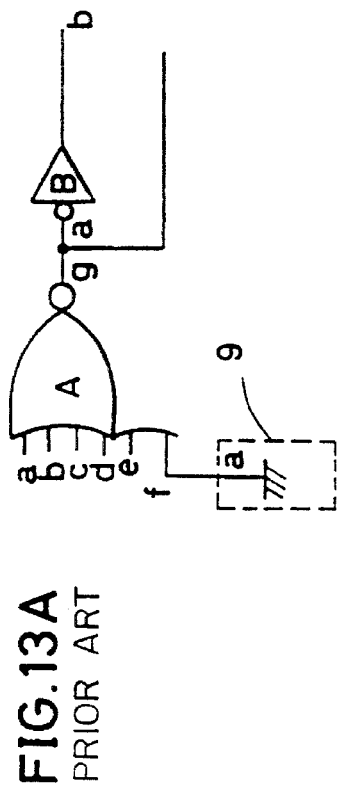
FIGS. 13A and 13B are views for illustrating a specific layout of a special standard cell when a 6 input AND circuit is embodied with standard cells.
Figure 13B:
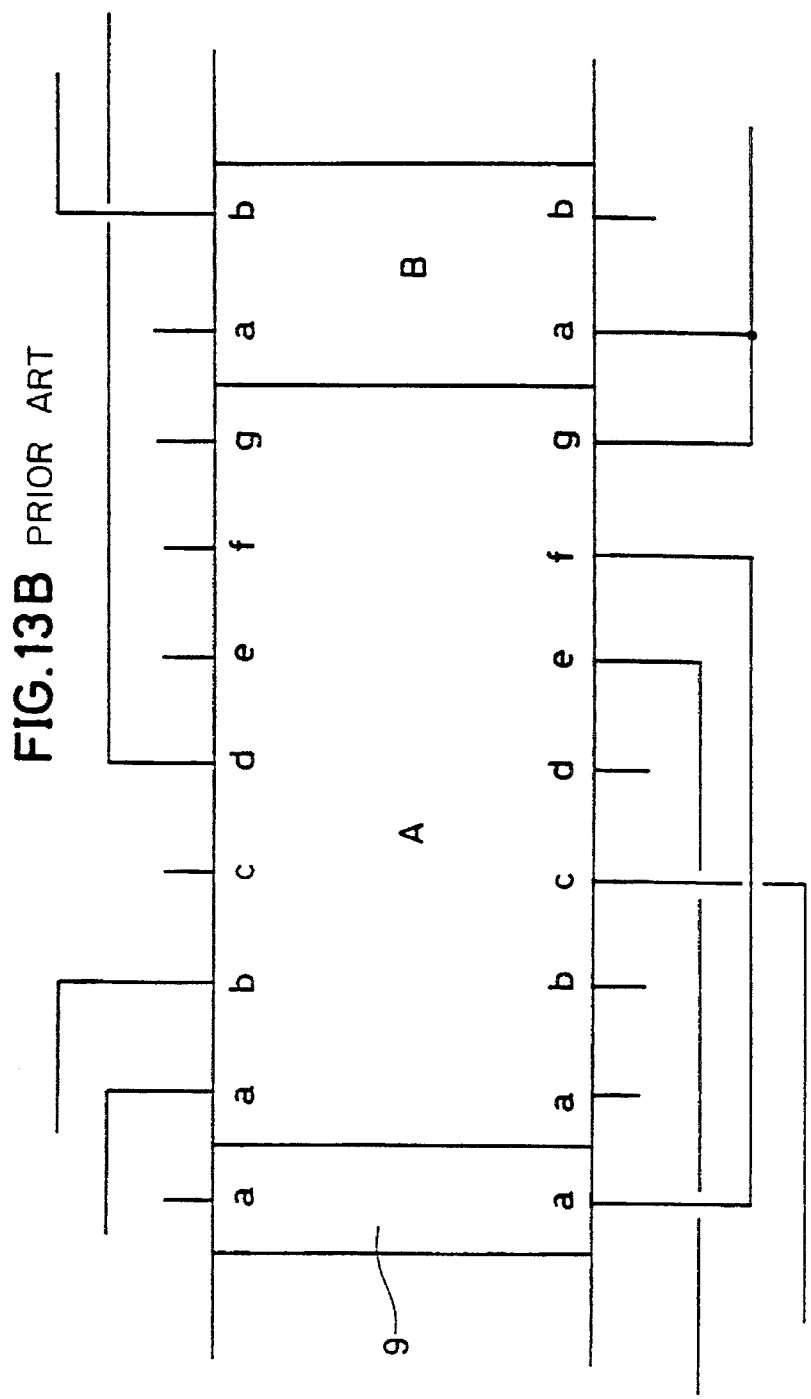
Figure 14:
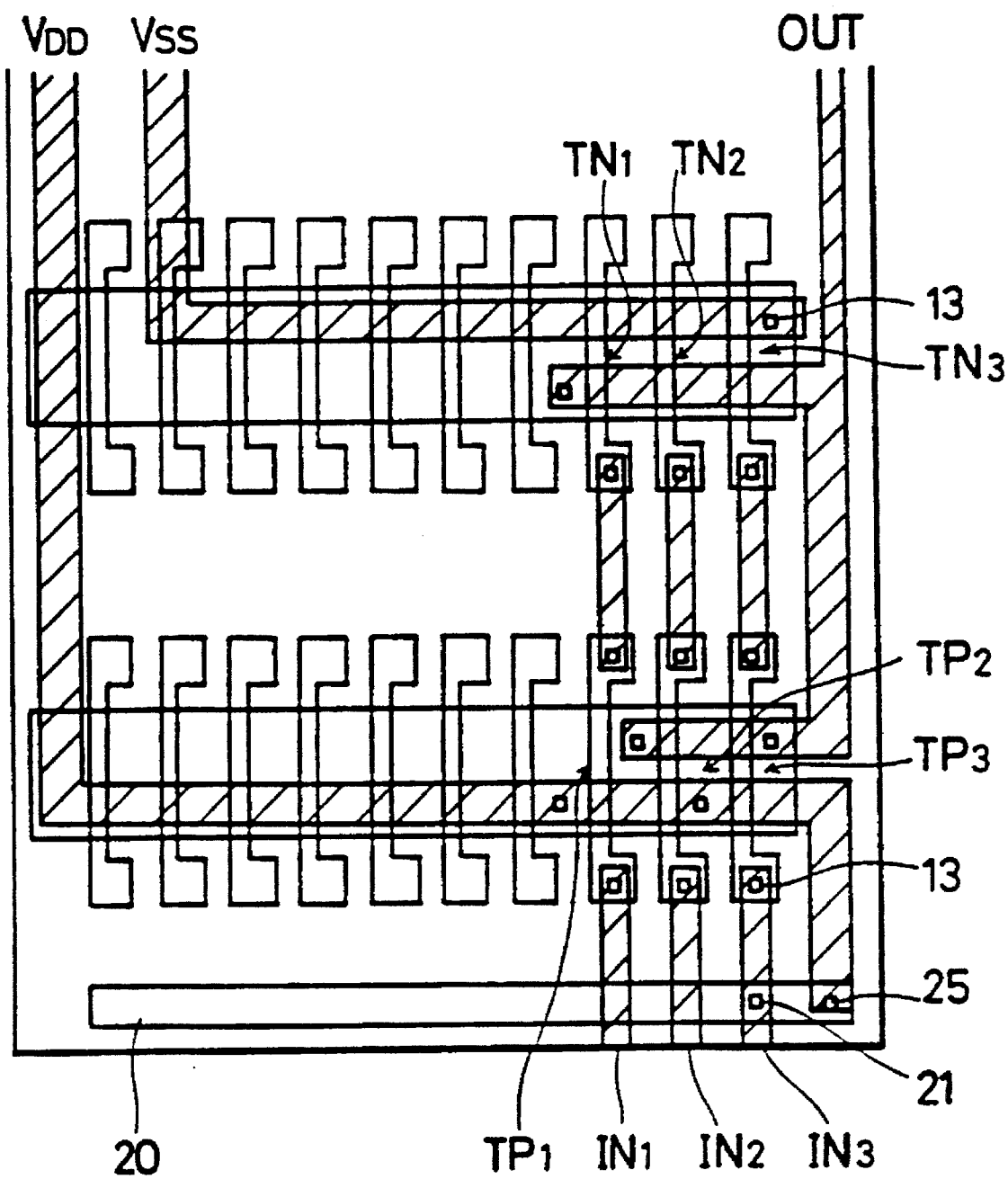
FIG. 14 is a view illustrating a method for clipping a conventional terminal to a predetermined potential in a gate array device.

FIGS. 3A and 3B illustrate a specific embodiment of the invention, and correspond to FIGS. 13A and 13B for the prior art, respectively. The same references indicate the same portions or members. Referring to FIGS. 3A and 3B, by the provision of the via hole 10 in a 6 input AND circuit, the required area can be reduced by the amount corresponding to the special standard cell in the 6 input AND circuit.

Figure 4A:
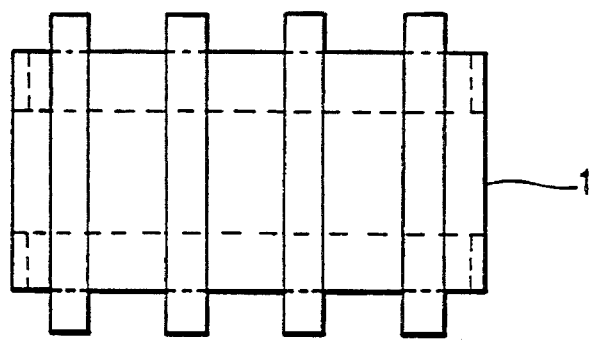
FIGS. 4A–4C show steps in an interconnecting method for a semiconductor integrated circuit device according to the invention.
Figure 4B:
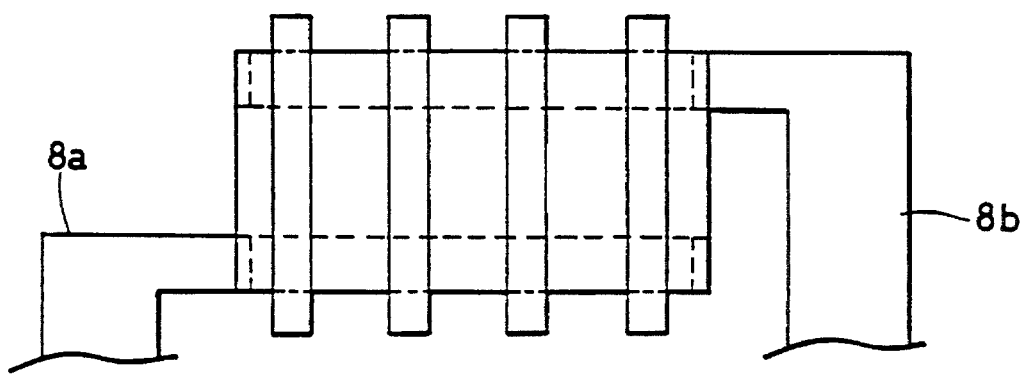
Figure 4C:
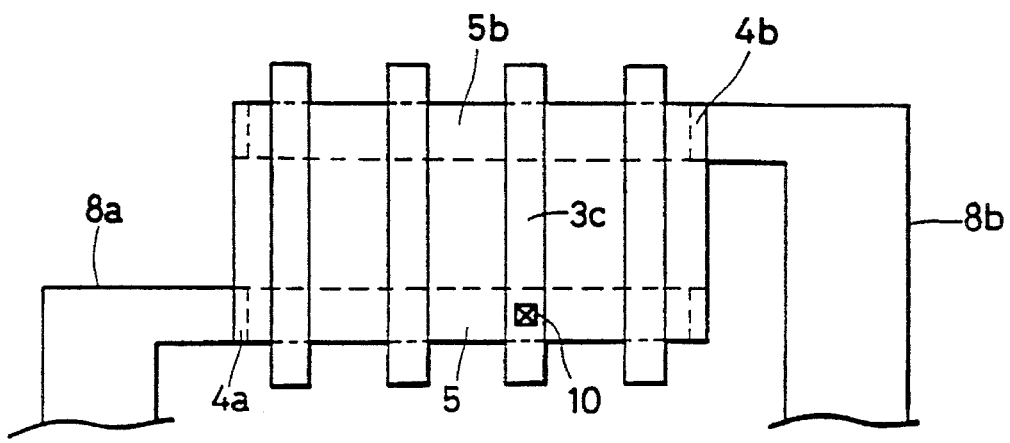

Now, referring to FIGS. 4A–4C, an interconnecting method for the semiconductor integrated circuit device according to the invention will be described.

First, in the manufacturing method according to the invention, a plurality of standard cells 1 having predetermined functions are provided. However, only one standard cell 1 is illustrated in this figure for clarification. Then, with reference to FIG. 4B, a power supply line 8A is coupled to an input pin 4a at a power line side, and a ground line 8b is coupled through an input pin 4b at a ground side. Then, referring to FIG. 4C, if power signals are required, for instance, in the metal interconnection layer 3c, the via hole 10 is formed at the intersection of the metal interconnection 5a for the power supply line and the metal interconnection layer 3c, and an interconnection layer is formed therein.

The description of the embodiment has been made with respect to the power signal line. However, the present invention may be applied to various signal lines such as clock signal lines and reset signal lines, if they commonly existing the respective standard cells.

Figure 5A:
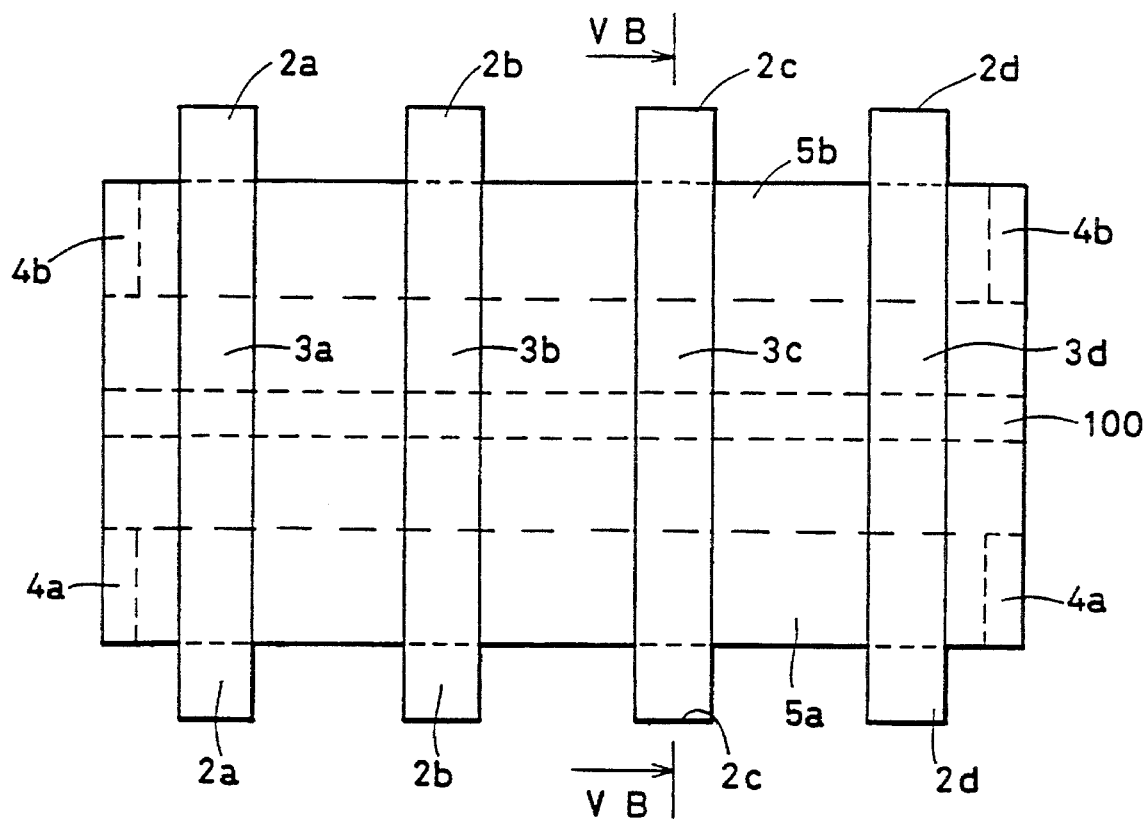
FIGS. 5A and 5B illustrate another embodiment of the invention.
Figure 5B:
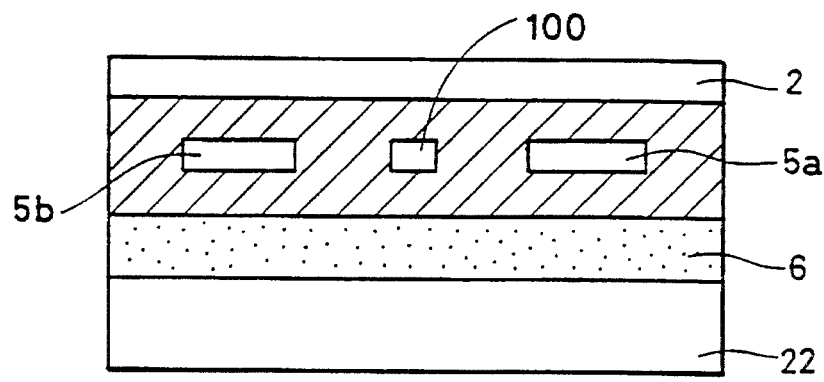
Figure 6:
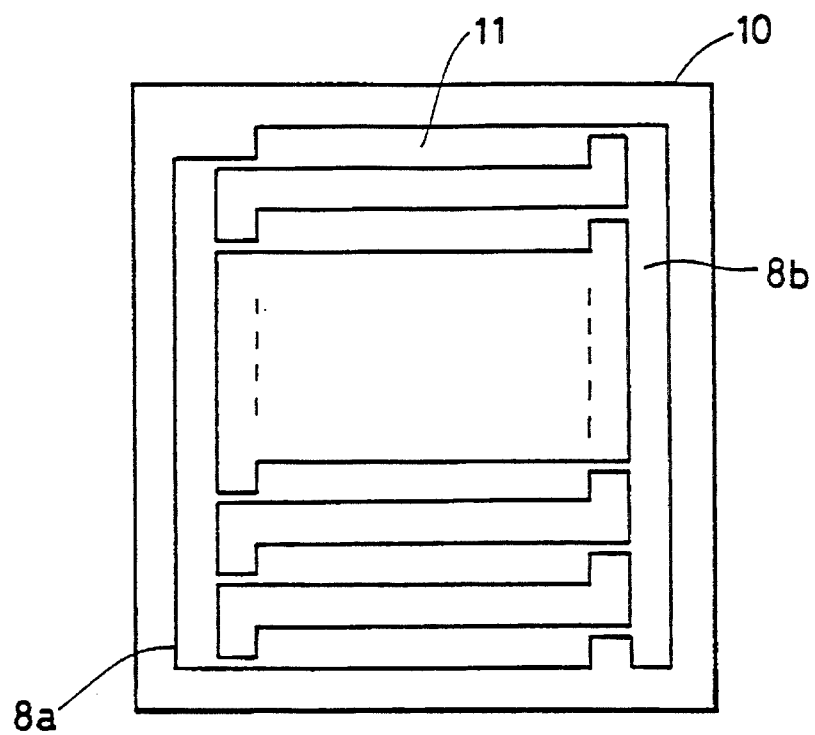
FIG. 6 is a schematic view of a semi-custom LSI fabricated with standard cells.
Figure 9A:
FIGS. 9(a)–(b) are schematic views of a 6 input AND circuit to which the invention is applied.
Figure 9B:
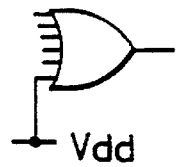
Figure 7:
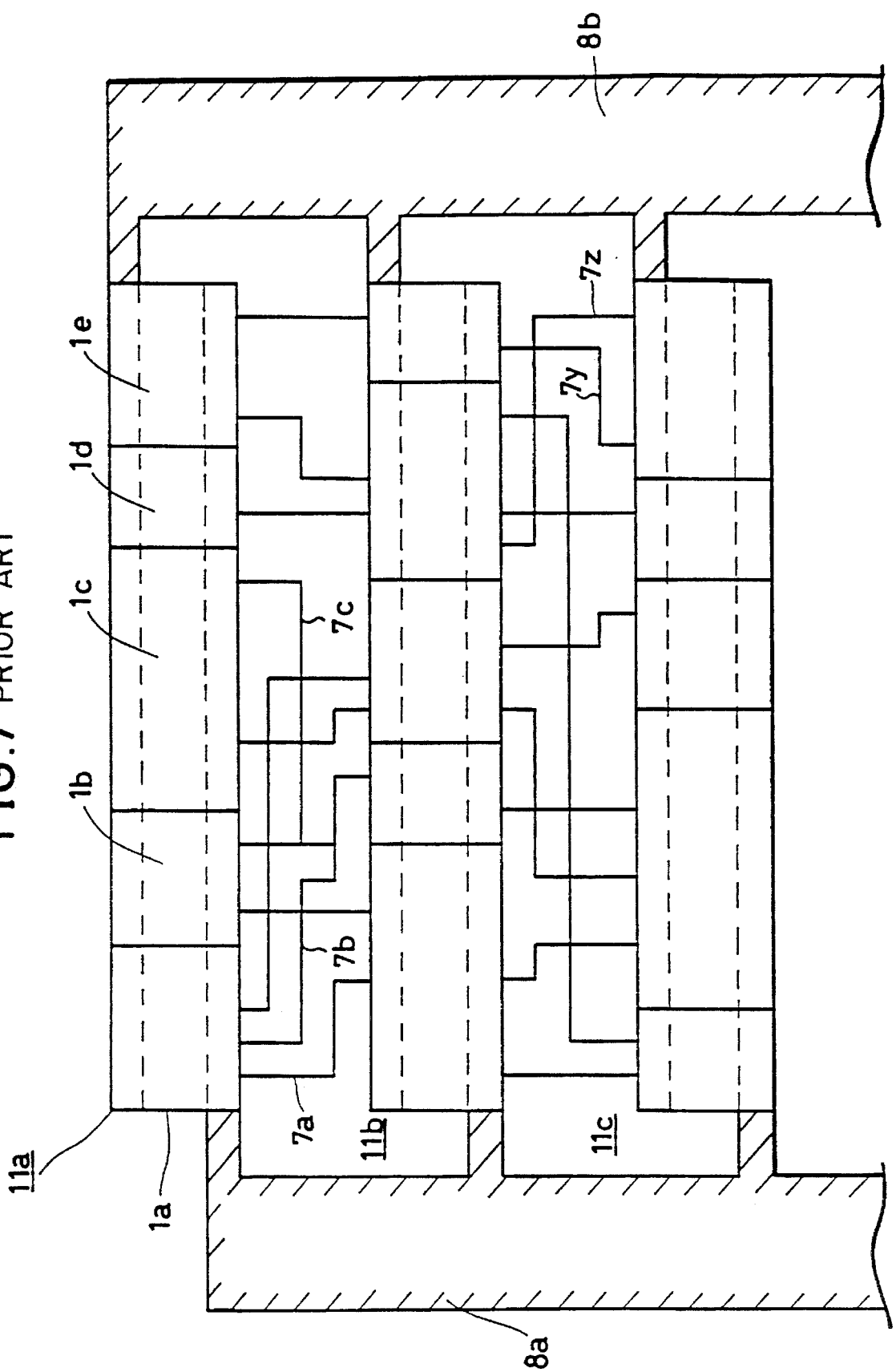
FIG. 7 is a fragmentary enlarged view of FIG. 6.

A specific example of the latter case will be described with reference to FIGS. 5A and 5B. For example, if standard cells in which a clock line 100 exists similarly to the power supply line and the ground line in the standard cells, as shown in FIGS. 5A and 5B, this clock line 100 and an external terminal can be coupled together in a method according to the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device comprising:
   a plurality of standard cells used for automatically laying out the integrated circuit device in a CAD system, each of said standard cells having a prescribed configuration;
   a modified standard cell having a configuration which is different from said prescribed configuration, and
   a local signal line common to all standard cells and at least said one modified standard cell, each standard cell including:
      at least one I/O terminal crossing said common local signal line and isolated from said common local signal line by an insulator film, and
      at least one active element coupled to said at least one I/O terminal, and
   said at least one modified standard cell including a coupling interconnection layer extending through an insulator film within said cell for coupling said common local signal line to said at least one I/O terminal.

2. A semiconductor integrated circuit device according to claim 1, wherein said common local signal line includes a power supply signal line.

3. A semiconductor integrated circuit device according to claim 2, wherein said common local signal line further includes a ground line.

4. A semiconductor integrated circuit device according to claim 1, wherein said common local signal line includes a ground signal line.

5. A semiconductor integrated circuit device according to claim 1, wherein said common local signal line includes a clock signal line.

6. A semiconductor integrated circuit device according to claim 1, wherein said common local signal line includes a reset signal line.

7. A semiconductor integrated circuit device according to claim 1, wherein said standard cell includes a logic circuit.

8. A semiconductor integrated circuit device according to claim 1, wherein said standard cell includes a plurality of layers stacked in a vertical direction, and said common local signal line and said active element are formed in layers at different levels.

9. A semiconductor integrated circuit device according to claim 8, wherein said common local signal line and said active element are coupled together through a via hole in an insulator film formed therebetween.

10. A semiconductor integrated circuit device according to claim 8, wherein said signal line is formed in the layer higher than the layer in which said active element is formed.

11. A method for automatically interconnecting a semiconductor integrated circuit device with CAD comprising the steps of:

providing standard cells used for automatically laying out the semiconductor integrated circuit device in a CAD system, each standard cell having a prescribed configuration and including a local signal line common to said respective standard cells, a plurality of I/O terminals arranged to cross said local signal line by an insulator film, and an active element coupled to said I/O terminals;

coupling said common local signal line to said standard cells; and changing said prescribed configuration of at least one standard cell by coupling said common local signal line in said at least one standard cell to at least one of said I/O terminals through means penetrating said insulator film.

12. A wiring method for a semiconductor integrated circuit device according to claim 11, wherein, said step of coupling said common local signal line to at least one of said I/O terminals through said means penetrating said insulator film, includes the steps of forming a via hole in said insulator film, and coupling said common local signal line to at least one of said I/O terminals through said via hole.

13. A wiring method for a semiconductor integrated circuit device according to claim 11 wherein, said step of providing said standard cells includes the steps of providing a semiconductor substrate, forming on said semiconductor substrate a region in which said active element is formed, forming an insulator film over said region in which said active element is formed, and forming a region on said insulator film in which said plurality of I/O terminals and said active element coupled to said I/O terminals are formed.

14. An integrated circuit comprising:

a plurality of standard cells used for automatically laying out the integrated circuit in a CAD system, each of said cells having a prescribed configuration and including at least four I/O terminals, at least one altered standard cell including at least four I/O terminals and at least one active element coupled to said I/O terminals, a local signal line common to said all standard cells and to said altered standard cell, each standard cell including:

at least one I/O terminal crossing said common local signal line and isolated from said local signal line by an insulator film, and at least one active element coupled to said I/O terminals; and said altered standard cell including:

at least one I/O terminal crossing said common local signal line and coupled to said local signal line with a coupling interconnection layer penetrating an insulator film, such that said altered standard cell has a configuration which differs from said prescribed configuration of a standard cell by said coupling interconnecting layer.

* * * * *